(12) United States Patent
Nishii et al.

(10) Patent No.: US 11,824,014 B2
(45) Date of Patent: Nov. 21, 2023

(54) SEMICONDUCTOR DEVICE

(71) Applicant: Mitsubishi Electric Corporation, Tokyo (JP)

(72) Inventors: Akito Nishii, Tokyo (JP); Tatsuo Harada, Tokyo (JP); Katsumi Uryu, Tokyo (JP); Noritsugu Nomura, Tokyo (JP); Sho Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 17/155,016

(22) Filed: Jan. 21, 2021

(65) Prior Publication Data

US 2021/0305174 A1    Sep. 30, 2021

(30) Foreign Application Priority Data

Mar. 30, 2020 (JP) ................. 2020-059505

(51) Int. Cl.
  *H01L 23/00*        (2006.01)
(52) U.S. Cl.
  CPC ............ *H01L 23/562* (2013.01); *H01L 24/48* (2013.01); *H01L 2224/02165* (2013.01); *H01L 2224/04042* (2013.01)
(58) Field of Classification Search
  CPC .................. H01L 23/562; H01L 24/48; H01L 2224/02165; H01L 2224/04042; H01L 24/45; H01L 24/85; H01L 2224/05011; H01L 2224/05013; H01L 2224/05014; H01L 2224/05085; H01L 2224/05624; H01L 2224/05647; H01L 2224/45124;

(Continued)

(56) References Cited

U.S. PATENT DOCUMENTS

2001/0017393 A1    8/2001  Fujihira et al.
2001/0035560 A1   11/2001  Fujihira et al.
(Continued)

FOREIGN PATENT DOCUMENTS

JP    S61131856 U    8/1986
JP    H10-335679 A   12/1998
(Continued)

OTHER PUBLICATIONS

An Office Action; "Notice of Reasons for Refusal," mailed by the Japanese Patent Office dated Jul. 4, 2023, which corresponds to Japanese Patent Application No. 2020-059505 and is related to U.S. Appl. No. 17/155,016; with English language translation.

*Primary Examiner* — Elias Ullah
(74) *Attorney, Agent, or Firm* — Studebaker & Brackett PC

(57) ABSTRACT

According to one aspect, a semiconductor device includes: a buffer layer disposed on a front surface of a second semiconductor layer, and having at least one opening in plan view; and an electrode disposed over the second semiconductor layer and the buffer layer, and being in contact with the second semiconductor layer through the at least one opening, wherein the buffer layer has a higher Vickers hardness than the electrode, and a width w of each of the at least one opening satisfies $w<W_{th}$, where s is a thickness of the buffer layer, t is a thickness of the electrode, and $W_{th}=2\times(s\times t-s^2)^{0.5}$ holds true.

12 Claims, 4 Drawing Sheets

(58) Field of Classification Search
CPC . H01L 2224/45147; H01L 2224/85206; H01L 2924/1203; H01L 2924/13055; H01L 2924/13091; H01L 2924/35; H01L 2924/386; H01L 24/05; H01L 29/417; H01L 29/861
See application file for complete search history.

(56) References Cited

U.S. PATENT DOCUMENTS

| | | |
|---|---|---|
| 2003/0030120 A1 | 2/2003 | Fujihira et al. |
| 2004/0009638 A1* | 1/2004 | Tanaka ................ H01L 24/05 |
| | | 257/E23.015 |
| 2005/0151219 A1 | 7/2005 | Fujihira et al. |
| 2005/0179105 A1 | 8/2005 | Fujihira et al. |
| 2006/0244006 A1 | 11/2006 | Fujihira et al. |
| 2014/0284754 A1 | 9/2014 | Yamamoto |
| 2015/0333270 A1* | 11/2015 | Nowatari ............ H01L 51/0067 |
| | | 257/40 |

FOREIGN PATENT DOCUMENTS

| | | |
|---|---|---|
| JP | 2002-319685 A | 10/2002 |
| JP | 2003-188391 A | 7/2003 |
| JP | 2007103656 A | 4/2007 |
| JP | 2014029975 A | 2/2014 |

* cited by examiner

SEMICONDUCTOR DEVICE

BACKGROUND OF THE INVENTION

Field of the Invention

The present disclosure relates to semiconductor devices.

Description of the Background Art

In a semiconductor device, a semiconductor layer can be damaged when external wiring used for connection to an external circuit is joined to an electrode.

Damage of the semiconductor layer causes a problem of a diode, for example, as described below.

One example of the performance required for the diode is that in reducing a loss at recovery. There are various methods for reducing the loss at recovery, including a method of reducing impurity concentration of an anode layer, a method of reducing the thickness of the semiconductor layer, and a method of reducing a life time of carriers in the semiconductor layer. From among these methods, the method of reducing the impurity concentration of the anode layer is a method of reducing the density of the carriers in the semiconductor layer in an on state to reduce a recovery current at switching to thereby reduce the loss.

In the diode, a breakdown voltage is held by a depletion layer spreading in the semiconductor layer from a PN junction in a breakdown voltage held state or in a reverse bias application state as in recovery operation. The depletion layer spreads mainly toward a drift layer, but is also likely to spread toward the anode layer when the anode layer has a lower impurity concentration to reduce the loss at recovery. The breakdown voltage is thus reduced when the anode layer is thin.

An effective thickness of the anode layer can locally be reduced by damage, such as a scratch, a dent, and further a crack, of the anode layer. The concentration and the thickness of the anode layer are usually designed not to cause punch-through due to the spread of the depletion layer to an anode electrode. When the anode layer has an extremely thin portion compared to the designed thickness, however, the depletion layer reaches the anode electrode to cause a problem of reduction in breakdown voltage or breakdown of the device due to the difficulty in holding the breakdown voltage.

Japanese Patent Application Laid-Open No. 2014-029975 discloses, as a structure to prevent damage of a semiconductor layer when external wiring is joined to an electrode, a structure in which an insulating layer is disposed immediately below a region where the external wiring is joined to the electrode to separate the region where the external wiring and the electrode are joined to each other and a region where the electrode and the semiconductor layer are in contact with each other in plan view.

The structure in which the region where the external wiring and the electrode are joined to each other and the region where the electrode and the semiconductor layer are in contact with each other are separated in plan view as disclosed in Japanese Patent Application Laid-Open No. 2014-029975, however, causes a problem in that wiring resistance is generated in accordance with the distance from the external wiring to the semiconductor layer to increase a loss in an on state.

One cause of the damage of the semiconductor layer is foreign matter on or inside the anode electrode. When the foreign matter is present immediately below the region where the external wiring is joined, the foreign matter is pushed into the anode electrode at joining of the external wiring. If the pushed foreign matter reaches the semiconductor layer, the semiconductor layer is damaged.

It is required to prevent such damage of the semiconductor layer caused by the foreign matter and to suppress resistance between the external wiring and the semiconductor layer compared with that in Japanese Patent Application Laid-Open No. 2014-029975.

SUMMARY

It is an object of the present disclosure to provide a semiconductor device that can suppress resistance between external wiring and a semiconductor layer and suppress frequency of damage of the semiconductor layer caused by foreign matter at connection of the external wiring.

A semiconductor device according to a first aspect of the present disclosure includes: a first semiconductor layer; a second semiconductor layer disposed on a front surface of the first semiconductor layer, and having a different conductivity type from the first semiconductor layer; a buffer layer disposed on a front surface of the second semiconductor layer, and having at least one opening in plan view; and an electrode disposed over the second semiconductor layer and the buffer layer, and being in contact with the second semiconductor layer through the at least one opening. The buffer layer has a higher Vickers hardness than the electrode. A width w of each of the at least one opening satisfies $w<W_{th}$, where s is a thickness of the buffer layer, t is a thickness of the electrode, and $W_{th}=2\times(s\times t-s^2)^{0.5}$ holds true.

Since the buffer layer disposed on the front surface of the second semiconductor layer, and having the at least one opening in plan view is included, resistance between the external wiring and the semiconductor layer can be suppressed. Furthermore, since the width w of each of the at least one opening satisfies $w<W_{th}$, frequency of the damage of the semiconductor layer caused by the foreign matter at connection of the external wiring can be suppressed.

A semiconductor device according to a second aspect of the present disclosure includes: a first semiconductor layer; a second semiconductor layer disposed on a front surface of the first semiconductor layer, and having a different conductivity type from the first semiconductor layer; a conductive buffer layer disposed at least selectively on a front surface of the second semiconductor layer; and an electrode disposed on a front surface of the buffer layer. The buffer layer has a higher Vickers hardness than the electrode.

Since the buffer layer is conductive, resistance between the external wiring and the semiconductor layer can be suppressed. Furthermore, since the buffer layer has a higher Vickers hardness than the electrode, frequency of the damage of the semiconductor layer caused by the foreign matter at connection of the external wiring can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

In description of embodiments of the present disclosure, an N-type and a P-type as conductivity types are interchangeable. In a case where the N-type and the P-type are interchanged, names dependent on the conductivity types in the embodiments should be read differently, for example, an anode electrode should be read as a cathode electrode, and an anode layer should be read as a cathode layer.

A. Embodiment 1

<A-1. Configuration and Operation>

Figure 1:
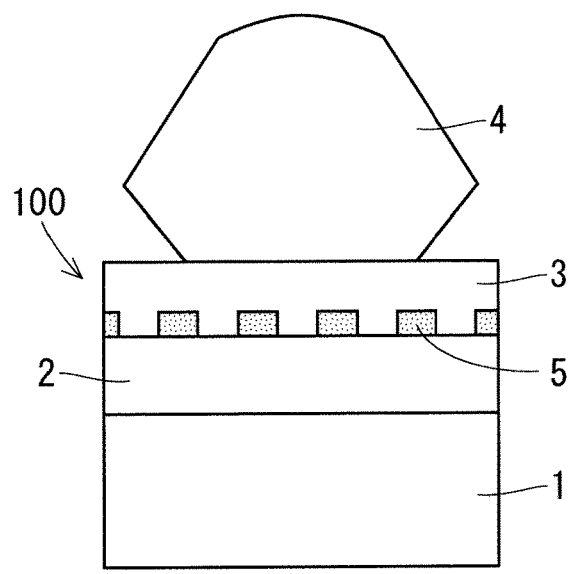
FIG. 1 is a cross-sectional view of a semiconductor device according to Embodiment 1.

FIG. 1 is a cross-sectional view of a semiconductor device 100 according to Embodiment 1.

The semiconductor device 100 includes a drift layer 1 as a first semiconductor layer, an anode layer 2 as a second semiconductor layer, an anode electrode 3 as an electrode, and a buffer layer 5. External wiring 4 illustrated in FIG. 1 is wiring to make electrical connection between the semiconductor device 100 and an outside.

The drift layer 1 is an N-type semiconductor layer. The anode layer 2 is a semiconductor layer having a different conductivity type from the drift layer 1, that is, a P-type.

The semiconductor device 100 is, for example, a diode, and is particularly used as a freewheeling diode (FWD) that is one of devices constituting a power module. In a case where the semiconductor device 100 is the diode, the semiconductor device 100 further includes an N-type cathode layer and a cathode electrode, which are not illustrated in FIG. 1. In this case, the cathode layer is disposed on a back surface of the drift layer 1 opposite a surface on which the anode layer 2 is disposed, and the cathode electrode is disposed on a back surface of the cathode layer. The semiconductor device 100, however, may not be the diode, and may be a metal-oxide-semiconductor field-effect transistor (MOSFET) or an insulated gate bipolar transistor (IGBT), for example. The semiconductor device 100 may also be a module or a device including the diode, the MOSFET, or the IGBT as a part thereof.

The drift layer 1 and the anode layer 2 are silicon semiconductors, for example.

The anode layer 2 is disposed on the front surface of the drift layer 1. The buffer layer 5 is disposed selectively on the front surface of the anode layer 2, and has a mesh shape in plan view. That is to say, the buffer layer 5 has openings in plan view.

Figure 2:
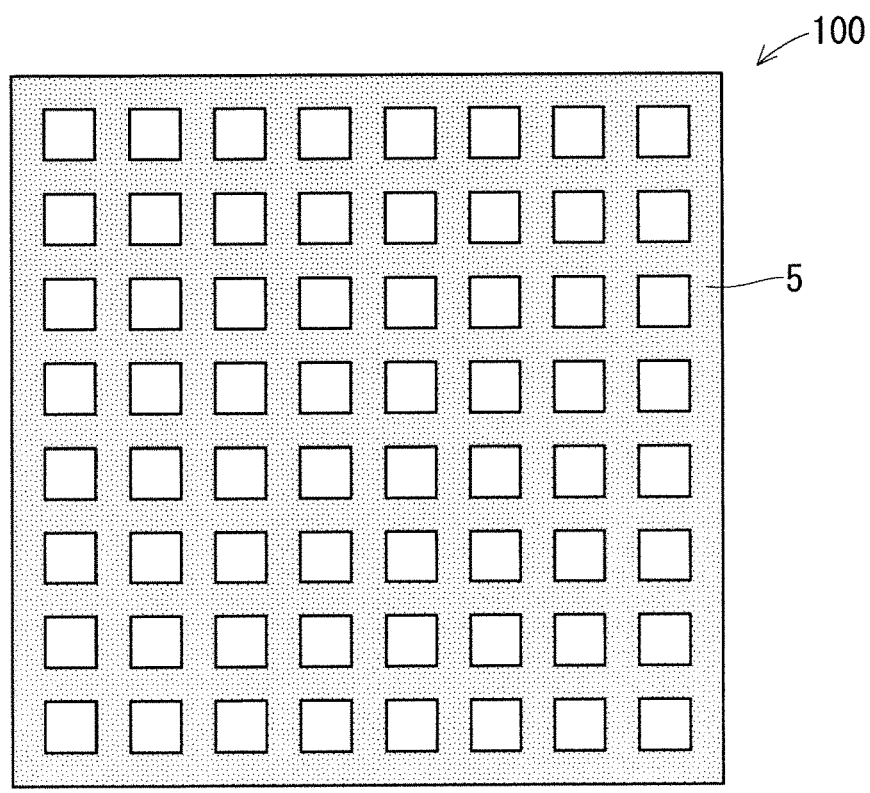
FIG. 2 is a plan view illustrating the shape of a buffer layer of the semiconductor device according to Embodiment 1.

A region composed of the openings of the buffer layer 5 and the buffer layer 5 in plan view occupies the entirety of the front surface of the drift layer 1 in plan view as illustrated in FIG. 2. The influence of variations in location when the external wiring 4 is joined can thereby be suppressed.

The anode electrode 3 is disposed on front sides of the anode layer 2 and the buffer layer 5, and is in contact with the anode layer 2 through the openings of the buffer layer 5.

The buffer layer 5 has a higher Vickers hardness than the anode electrode 3. As a material for the anode electrode 3, aluminum having a Vickers hardness of 0.44 GPa or copper having a Vickers hardness of 0.80 GPa is used, for example. The buffer layer 5 is an insulator including silicon oxide or silicon nitride, for example, having a higher Vickers hardness than aluminum or copper.

Since the buffer layer 5 has a higher Vickers hardness than the anode electrode 3, frequency or a degree of a push of foreign matter located inside the anode electrode 3 and adhering to an upper surface of the anode electrode 3 into the semiconductor device 100 beyond the buffer layer 5, that is, into the anode layer 2 beyond the buffer layer 5 can be suppressed compared with a case without the buffer layer 5. Frequency of damage of the anode layer 2 can thereby be suppressed.

Since the buffer layer 5 has the mesh shape in plan view, and has the openings in plan view, resistance between the external wiring 4 and the anode layer 2 can be suppressed to reduce the loss at energization even in a case where the buffer layer 5 is the insulator, such as silicon oxide and silicon nitride.

Figure 3:
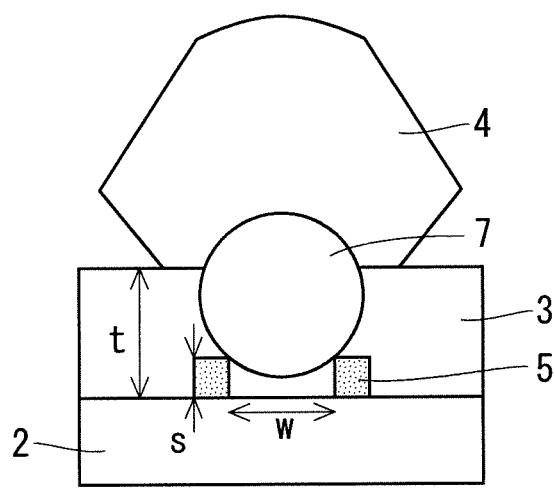
FIG. 3 is a cross-sectional view of the semiconductor device according to Embodiment 1.

The openings of the mesh of the buffer layer 5 are provided so that a width w of each of the openings of the mesh satisfies $w<W_{th}$, where $W_{th}=2\times(s\times t-s^2)^{0.5}$ holds true. Herein, s is the thickness of the buffer layer 5, and t is the thickness of the anode electrode 3 as illustrated in FIG. 3. The thickness of the anode electrode 3 refers to the distance from an interface between the anode electrode 3 and the anode layer 2 to the front surface of the anode electrode 3.

The condition that $w<W_{th}$ is obtained from a condition that, in a case where spherical foreign matter 7 having a diameter of t or more is pushed from the anode electrode 3 toward the anode layer 2 when the external wiring 4 is joined, the foreign matter 7 does not reach the anode layer 2 by being stopped by the buffer layer 5. The buffer layer 5 and the anode layer 2 are assumed not to be deformed. Spherical foreign matter having a diameter of less than t does not reach the anode layer 2 even if it is pushed from the anode electrode 3 toward the anode layer 2 when the external wiring 4 is joined because the thickness of the anode electrode 3 is t. The width w of each of the openings of the mesh of the buffer layer 5 satisfies $w<W_{th}$ as described above, so that frequency or the degree of the push of the foreign matter located inside the anode electrode 3 and adhering to the upper surface of the anode electrode 3 into the semiconductor device 100 beyond the buffer layer 5, that is, into the anode layer 2 beyond the buffer layer 5 can be suppressed compared with the case without the buffer layer 5. Frequency of the damage of the anode layer 2 can thereby be suppressed.

In a case where the anode electrode 3 has a thickness t of 4 μm and the buffer layer 5 has a thickness s of 1 μm, for example, foreign matter having a diameter of more than 4 μm can damage the anode layer 2 by being pushed by the external wiring 4 when the foreign matter is assumed to be spherical. The damage of the anode layer 2 caused by such foreign matter can be prevented when the width w of each of the openings of the mesh of the buffer layer 5 satisfies $w<W_{th}\approx3.5$ μm.

In summary, the semiconductor device 100 includes the buffer layer 5, and the width w of each of the openings of the buffer layer 5 satisfies $w<W_{th}$, so that resistance between the external wiring 4 and the anode layer 2 can be suppressed, and frequency of the damage of the anode layer 2 caused by the foreign matter when the wiring is joined can be suppressed. By suppressing frequency of the damage of the anode layer 2, frequency of reduction in breakdown voltage and the occurrence of breakdown of the semiconductor device 100 caused by variations in effective depth of the anode layer 2 can be suppressed.

With the structure of the semiconductor device 100 of the present disclosure, resistance between the external wiring 4 and the anode layer 2 can be suppressed, and frequency of the damage of the anode layer 2 caused by the foreign matter can be suppressed not only when the external wiring 4 is joined to the anode electrode 3 but also when the external wiring 4 and the anode electrode 3 are only in contact with each other as in a case where a test terminal is brought into contact.

<A-2. Effects>

The buffer layer 5 has a higher Vickers hardness than the anode electrode 3, the buffer layer 5 has at least one opening in plan view, and the width w of each of the at least one opening satisfies $w<W_{th}$. Thus, resistance between the external wiring 4 and the anode layer 2 can be suppressed, and frequency of the damage of the anode layer 2 caused by the foreign matter can be suppressed.

The region composed of the openings of the buffer layer 5 and the buffer layer 5 in plan view occupies the entirety of the front surface of the drift layer 1 in plan view. The influence of variations in location when the external wiring 4 is joined can thereby be suppressed.

The buffer layer 5 includes silicon oxide or silicon nitride. A configuration in which the buffer layer 5 has a higher Vickers hardness than the anode electrode 3 can thereby easily be achieved.

<A-3. Modifications>

The shape of the buffer layer 5 in plan view is not limited to the mesh shape described in <A-1. Configuration>. The buffer layer 5 may have any shape as long as it has at least one opening in plan view, and the width w of each of the at least one opening satisfies $w<W_{th}$. The anode electrode 3 is in contact with the anode layer 2 through the at least one opening of the buffer layer 5. Resistance between the external wiring 4 and the anode layer 2 can be reduced when the buffer layer 5 has the at least one opening, and frequency of the damage caused by the foreign matter can be suppressed when the width w of each of the at least one opening satisfies $w<W_{th}$.

Figure 4:
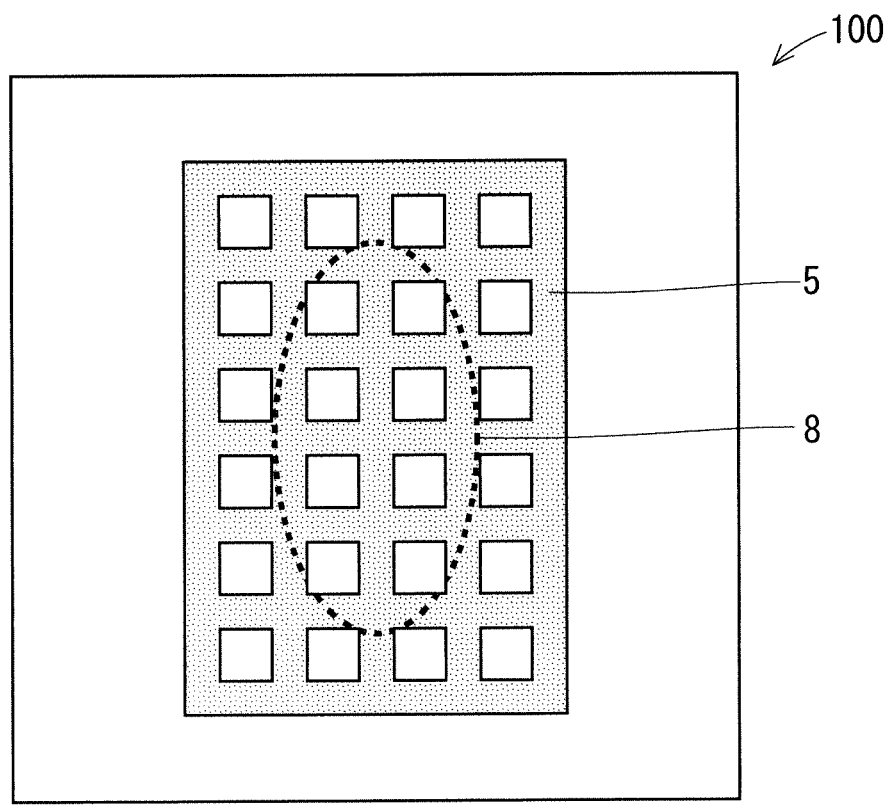
FIG. 4 is a plan view illustrating the shape of a buffer layer of a modification of the semiconductor device according to Embodiment 1.
Figure 5:
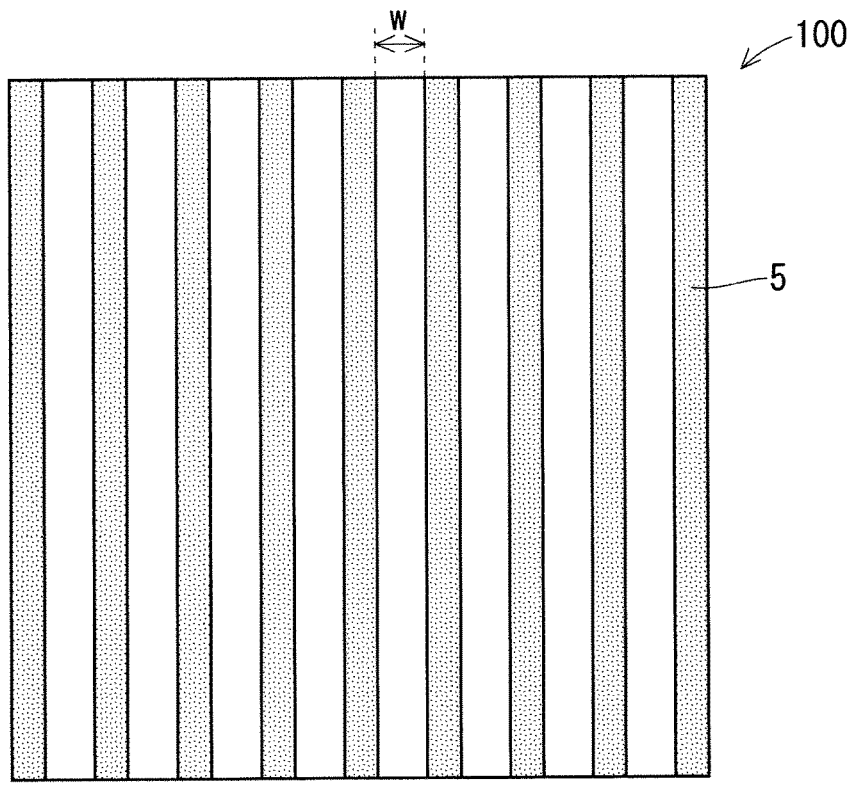
FIG. 5 is a plan view illustrating the shape of a buffer layer of a modification of the semiconductor device according to Embodiment 1.
Figure 6:
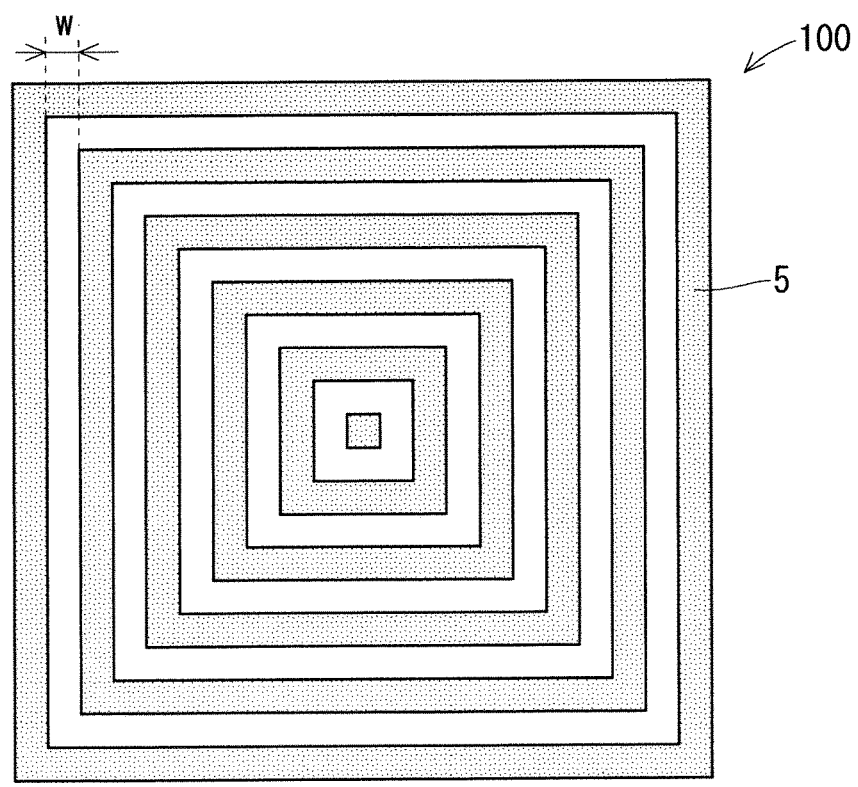
FIG. 6 is a plan view illustrating the shape of a buffer layer of a modification of the semiconductor device according to Embodiment 1.

FIGS. 4 to 6 illustrate modifications of the semiconductor device 100 each including the buffer layer 5 having a different shape in plan view.

FIG. 4 illustrates an example in which the buffer layer 5 has the mesh shape, but the region composed of the openings of the buffer layer 5 and the buffer layer 5 occupies only a partial region of the front surface of the anode layer 2. In a case where the buffer layer 5 is disposed so that the region composed of the openings of the buffer layer 5 and the buffer layer 5 occupies only the partial region of the front surface of the anode layer 2, the buffer layer 5 is disposed so that the region composed of the openings of the buffer layer 5 and the buffer layer 5 includes an external wiring connection region 8 where the external wiring 4 is connected. Since the region composed of the openings of the buffer layer 5 and the buffer layer 5 occupies only the partial region of the front surface of the anode layer 2, a region where the buffer layer 5 is not disposed in plan view can be increased to further suppress resistance between the external wiring 4 and the anode layer 2.

Each of the openings of the mesh of the buffer layer 5 may not have a rectangular shape as illustrated in FIGS. 2 and 4, and may have any shape contained within a rectangle that is $W_{th}$ in length on each side in plan view. Each of the openings has such a shape, so that resistance between the external wiring 4 and the anode layer 2 can be suppressed, and frequency of the damage of the anode layer 2 caused by the foreign matter can be suppressed.

The buffer layer 5 may not have the mesh shape, and may be shaped so that each of the openings of the buffer layer 5 has a linear shape having a width w of less than $W_{th}$. FIGS. 5 and 6 illustrate examples in each of which each of the openings of the buffer layer 5 has the linear shape having the width w of less than $W_{th}$.

FIG. 5 illustrates an example in which the buffer layer 5 has a striped shape in plan view.

FIG. 6 illustrates an example in which the buffer layer 5 has a concentric annular shape in plan view.

The buffer layer 5 may have a shape other than the shapes illustrated in FIGS. 5 and 6, such as a spiral shape, in plan view.

Since the buffer layer 5 has the at least one opening in plan view, and each of the at least one opening of the buffer layer 5 has the linear shape having the width of less than $W_{th}$, resistance between the external wiring 4 and the anode layer 2 can be suppressed, and frequency of the damage of the anode layer 2 caused by the foreign matter can be suppressed.

B. Embodiment 2

<B-1. Configuration and Operation>

A semiconductor device 101 according to the present embodiment includes a buffer layer 6 in place of the buffer layer 5 of the semiconductor device 100 according to Embodiment 1. The buffer layer 6 is made of a different material from the buffer layer 5. The buffer layer 6 may have a different shape from the buffer layer 5, and, with the difference, the semiconductor device 101 may differ from the semiconductor device 100 in how the anode electrode 3 and the anode layer 2 are in contact with each other or whether the anode electrode 3 and the anode layer 2 are in contact with each other. The semiconductor device 101 is otherwise the same as the semiconductor device 100.

The buffer layer 6 has a higher Vickers hardness than the anode electrode 3 and the external wiring 4. Thus, frequency at which the foreign matter located inside the anode electrode 3 and adhering to the upper surface of the anode electrode 3 reaches the anode layer 2 when the external wiring 4 is joined can be suppressed, and frequency of the damage of the anode layer 2 caused by the foreign matter can be suppressed.

The buffer layer 6 is a conductor. Since the buffer layer 6 is the conductor, resistance between the external wiring 4 and the anode layer 2 can be suppressed even when the buffer layer 6 is provided.

The buffer layer 6 includes any of titanium, tungsten, molybdenum, and hafnium, for example. Titanium, tungsten, molybdenum, and hafnium have a higher Vickers hardness than aluminum and copper used for the anode electrode 3 and the external wiring 4. Titanium, tungsten, molybdenum, and hafnium are conductive materials commonly used in a semiconductor manufacturing process, and process control of them is easy.

Figure 7:
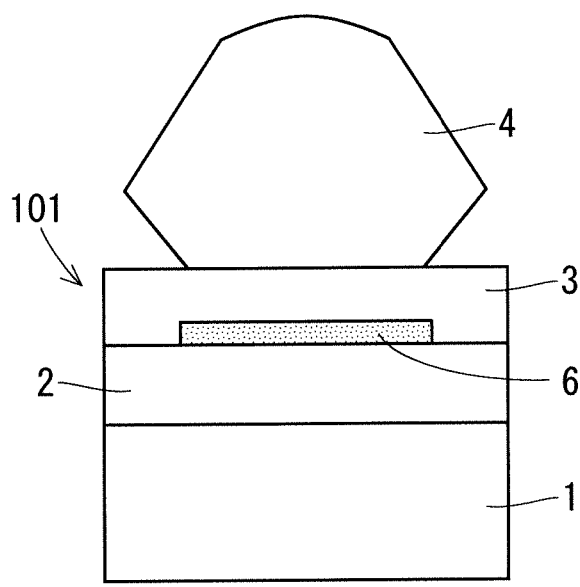
FIG. 7 is a cross-sectional view of a semiconductor device according to Embodiment 2.

The buffer layer 6 is disposed at least selectively on the front surface of the anode layer 2. The buffer layer 6 may have the same shape as any of the buffer layer 5 according to Embodiment 1 and the buffer layer 5 according to the modifications of Embodiment 1, for example. In contrast to Embodiment 1, the buffer layer 6 may have a shape not having any openings in plan view. The buffer layer 6 having the shape not having any openings in plan view may be disposed selectively on the anode layer 2 as illustrated in FIGS. 7 and 8, for example, or may be disposed on the entirety of the anode layer 2.

Figure 8:
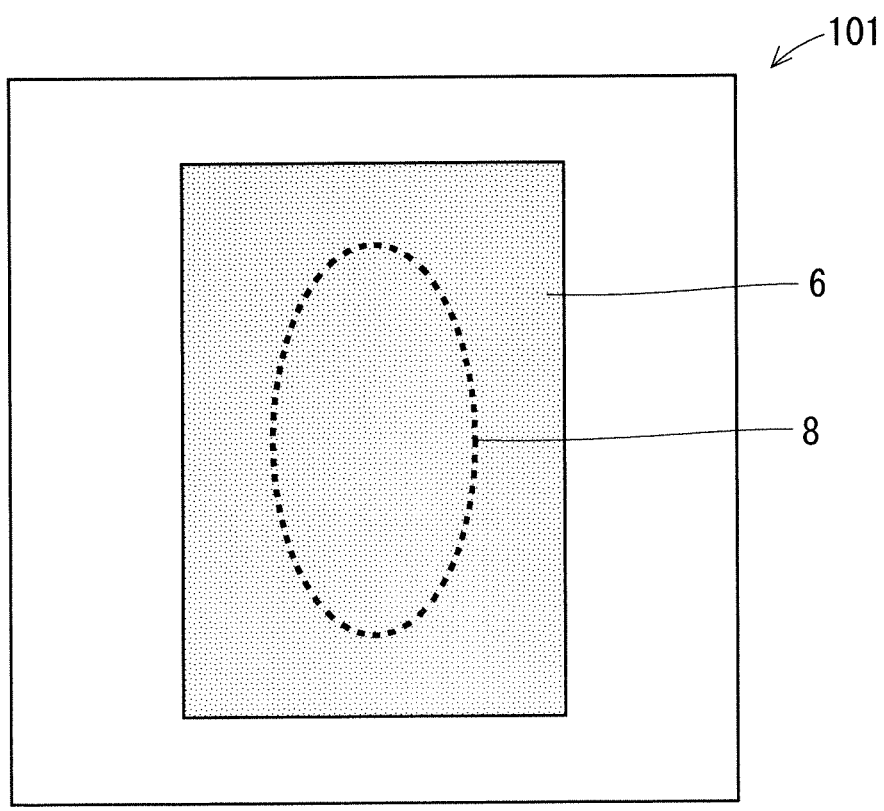
FIG. 8 is a plan view illustrating the shape of a buffer layer of the semiconductor device according to Embodiment 2.

In a case where the buffer layer 6 is disposed selectively on the anode layer 2, the buffer layer 6 is disposed in a region including the external wiring connection region 8 where the external wiring 4 is joined to the anode electrode 3 in plan view as illustrated in FIG. 8.

<B-2. Effects>

The semiconductor device 101 includes the conductive buffer layer 6 disposed at least selectively on the front surface of the anode layer 2 and having a higher Vickers hardness than the anode electrode 3. Thus, resistance between the external wiring 4 and the anode layer 2 can be suppressed, and frequency of the damage of the anode layer 2 caused by the foreign matter can be suppressed.

The buffer layer 6 includes any of titanium, tungsten, molybdenum, and hafnium. Titanium, tungsten, molybdenum, and hafnium are the conductive materials commonly used in the semiconductor manufacturing process, and process control of them is easy.

The embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a first semiconductor layer;
a second semiconductor layer disposed on a front surface of the first semiconductor layer, and having a different conductivity type from the first semiconductor layer;
a buffer layer disposed on a front surface of the second semiconductor layer, and having at least one opening in plan view; and
an electrode disposed over the second semiconductor layer and the buffer layer, and being in contact with the second semiconductor layer through the at least one opening, wherein
the buffer layer has a higher Vickers hardness than the electrode, and
a width w of each of the at least one opening satisfies $w<W_{th}$, where s is a thickness of the buffer layer, t is a thickness of the electrode, and $W_{th}=2\times(s\times t-s^2)^{0.5}$ holds true.

2. The semiconductor device according to claim 1, wherein
a region composed of the at least one opening and the buffer layer in plan view occupies only a partial region of the front surface of the first semiconductor layer in plan view.

3. The semiconductor device according to claim 1, wherein
a region composed of the at least one opening and the buffer layer in plan view occupies an entirety of the front surface of the first semiconductor layer in plan view.

4. The semiconductor device according to claim 1, wherein
each of the at least one opening has a shape contained within a rectangle that is $W_{th}$ in length on each side in plan view.

5. The semiconductor device according to claim 1, wherein
the buffer layer has a mesh shape in plan view.

6. The semiconductor device according to claim 1, wherein
each of the at least one opening has a linear shape having a width of less than $W_{th}$.

7. The semiconductor device according to claim 6, wherein
the buffer layer has a striped shape in plan view.

8. The semiconductor device according to claim 6, wherein
the buffer layer has a concentric annular shape in plan view.

9. The semiconductor device according to claim 1, wherein
the buffer layer includes silicon oxide or silicon nitride.

10. A semiconductor device comprising:
a first semiconductor layer;
a second semiconductor layer disposed on a front surface of the first semiconductor layer, and having a different conductivity type from the first semiconductor layer;
a conductive buffer layer disposed selectively on a front surface of the second semiconductor layer; and
an electrode disposed on a front surface of the buffer layer, wherein
the buffer layer has a higher Vickers hardness than the electrode, and
a portion of the electrode directly contacts the second semiconductor layer.

11. The semiconductor device according to claim 10, wherein
the buffer layer includes any of titanium, tungsten, molybdenum, and hafnium.

12. The semiconductor device according to claim 10, wherein
in a plan view, an area of the buffer layer is less than an area of the electrode.

* * * * *